(12) United States Patent
Wang et al.

(10) Patent No.: US 10,924,099 B2
(45) Date of Patent: Feb. 16, 2021

(54) COMPARATOR AND ANALOG-TO-DIGITAL CONVERTER

(71) Applicant: BOE TECHNOLOGY GROUP CO., LTD., Beijing (CN)

(72) Inventors: Tangxiang Wang, Beijing (CN); Chen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/643,241

(22) PCT Filed: Sep. 5, 2019

(86) PCT No.: PCT/CN2019/104546
§ 371 (c)(1),
(2) Date: Feb. 28, 2020

(87) PCT Pub. No.: WO2020/140469
PCT Pub. Date: Jul. 9, 2020

(65) Prior Publication Data
US 2020/0266811 A1 Aug. 20, 2020

(30) Foreign Application Priority Data
Jan. 2, 2019 (CN) .......................... 201910001454.3

(51) Int. Cl.
*H03K 5/24* (2006.01)
*H03M 1/34* (2006.01)
(52) U.S. Cl.
CPC ............ *H03K 5/2472* (2013.01); *H03M 1/34* (2013.01)
(58) Field of Classification Search
CPC ............................. H03M 1/34; H03K 5/2472
(Continued)

(56) References Cited

U.S. PATENT DOCUMENTS 5,231,351 A * 7/1993 Kordts .................... G01P 1/006
324/166
5,684,486 A * 11/1997 Ono ...................... H03M 1/362
341/159
(Continued)

FOREIGN PATENT DOCUMENTS

CN 101038617 A 9/2007
CN 101373955 A 2/2009
(Continued)

OTHER PUBLICATIONS

PCT International Search Report, Application No. PCT/CN2019/104546, dated Nov. 29, 2019, 6 pages: with English translation.
(Continued)

*Primary Examiner* — Lam T Mai
(74) *Attorney, Agent, or Firm* — Armstrong & Teasdale LLP

(57) ABSTRACT

Embodiments of the present disclosure provide a comparator. The comparator includes a first current source circuit, a pre-amplifier circuit, an amplifier circuit, a comparison circuit, and an output circuit. The first current source circuit is configured to provide a first constant current to the pre-amplifier circuit. The pre-amplifier circuit is configured to amplify a first input signal into a first pre-amplified signal and amplify a second input signal into a second pre-amplified signal based on a first constant current. The amplifier circuit includes a current mirror and a load circuit. The load circuit comprises a differential diode-connected transistor. The comparison circuit is configured to compare the first amplified signal with the second amplified signal. The output circuit is configured to output a first voltage or a second voltage based on a result of the comparison.

20 Claims, 3 Drawing Sheets

(58) Field of Classification Search
USPC ................................................ 341/125–160
See application file for complete search history.

(56) References Cited

U.S. PATENT DOCUMENTS

| | | | | |
|---|---|---|---|---|
| 7,075,353 | B1* | 7/2006 | Wan | .......................... G06F 1/04 |
| | | | | 327/295 |
| 10,310,680 | B2* | 6/2019 | Yang | .................... A61B 5/0428 |
| 2003/0154045 | A1* | 8/2003 | Sung | ..................... H03M 1/165 |
| | | | | 702/107 |
| 2008/0238521 | A1 | 10/2008 | Huang | |
| 2013/0120027 | A1 | 5/2013 | Inoue | |
| 2015/0194973 | A1* | 7/2015 | Furuta | .................. G04F 10/005 |
| | | | | 348/308 |
| 2016/0013804 | A1* | 1/2016 | Peluso | ................. H03K 5/2481 |
| | | | | 341/164 |
| 2016/0087607 | A1* | 3/2016 | Rajaee | ................... H03K 3/023 |
| | | | | 327/97 |

FOREIGN PATENT DOCUMENTS

| | | |
|---|---|---|
| CN | 101562441 A | 10/2009 |
| CN | 102111126 A | 6/2011 |
| CN | 103762962 A | 4/2014 |
| CN | 104579202 A | 4/2015 |
| CN | 104579260 A | 4/2015 |
| CN | 106067822 A | 11/2016 |
| CN | 107888171 A | 4/2018 |
| CN | 109728801 A | 5/2019 |

OTHER PUBLICATIONS

PCT Written Opinion, Application No. PCT/CN2019/104546, dated Nov. 29, 2019, 6 pages: with English translation of relevant part.
China First Office Action, Application No. 201910001454.3, dated Apr. 17, 2020, 16 pps.: with English translation. 0.
China Second Office Action, Application No. 201910001454.3, dated Jan. 6, 2021, 26 pps. with English translation.

* cited by examiner

COMPARATOR AND ANALOG-TO-DIGITAL CONVERTER

CROSS REFERENCE TO RELATED APPLICATIONS

This patent application is a National Stage Entry of PCT/CN2019/104546 filed on Sep. 5, 2019, which claims the benefit and priority of Chinese Patent Application No. 201910001454.3 filed on Jan. 2, 2019, the disclosures of which are incorporated by reference herein in their entirety as part of the present application.

BACKGROUND

Embodiments of the present disclosure relate to the field of integrated circuit technology, and more particularly, to a comparator and a related analog-to-digital converter.

With the rapid development of integrated circuits, digital communications have been widely used. As a key device to realize analog-to-digital conversion, the analog-to-digital converter has developed rapidly. In most analog-to-digital converters, the comparator is a core device, and its accuracy and speed play a vital role in the entire analog-to-digital converter.

The accuracy of the comparator determines the fineness of the difference between two signals that the comparator can compare. The speed of the comparator determines a response time of the comparator. High-precision comparators are usually more complex, so their response speed is relatively slow. Some simplified comparators can achieve faster response speeds, but their accuracy may not meet the needs of the product.

BRIEF DESCRIPTION

Embodiments of the present disclosure provide a comparator and an analog-to-digital converter.

A first aspect of the present disclosure provides a comparator. The comparator includes a first current source circuit, a pre-amplifier circuit, an amplifier circuit, a comparison circuit, and an output circuit. The first current source circuit is coupled to the pre-amplifier circuit, and is configured to provide a first constant current to the pre-amplifier circuit. The pre-amplifier circuit is coupled to the amplifier circuit via a first node and a second node, and is configured to amplify a first input signal from a first input terminal into a first pre-amplified signal and amplify a second input signal from a second input terminal into a second pre-amplified signal based on the first constant current, and provide the first pre-amplified signal and the second pre-amplified signal to the amplifier circuit via the first node and the second node respectively. The amplifier circuit includes a current mirror and a load circuit. The amplifier circuit is coupled to the comparison circuit via a third node and a fourth node, and is configured to generate a first mirror signal of the first pre-amplified signal and a second mirror signal of the second pre-amplified signal by the current mirror, generate a first amplified signal and a second amplified signal by the load circuit based on the first mirror signal and the second mirror signal respectively, and provide the first amplified signal and the second amplified signal to the comparison circuit via the third node and the fourth node respectively. The load circuit includes a differential diode-connected transistor. The comparison circuit is coupled to the output circuit via a fifth node, and is configured to compare the first amplified signal with the second amplified signal, and provide a result of the comparison to the output circuit via the fifth node. The output circuit is configured to output either a first voltage or a second voltage based on the result of the comparison.

In some embodiments of the present disclosure, the current mirror includes a first current mirror and a second current mirror. The first current mirror is coupled to the first node, a first voltage terminal, the load circuit, and the third node, and is configured to generate the first mirror signal based on the first pre-amplified signal, and provide the first mirror signal to the third node. The second current mirror is coupled to the second node, the first voltage terminal, the load circuit, and the fourth node, and is configured to generate the second mirror signal based on the second pre-amplified signal, and provide the second mirror signal to the fourth node.

In some embodiments of the present disclosure, the first current mirror includes a first transistor and a third transistor, and the second current mirror includes a second transistor and a fourth transistor. A second electrode of the first transistor is coupled to a control electrode of the first transistor and the first node, and a first electrode of the first transistor is coupled to the first voltage terminal. A second electrode of the second transistor is coupled to a control electrode of the second transistor and the second node, and a first electrode of the second transistor is coupled to the first voltage terminal. A control electrode of the third transistor is coupled to the control electrode of the first transistor, a first electrode of the third transistor is coupled to the first voltage terminal, and a second electrode of the third transistor is coupled to the third node. A control electrode of the fourth transistor is coupled to the control electrode of the second transistor, a first electrode of the fourth transistor is coupled to the first voltage terminal, and a second electrode of the fourth transistor is coupled to the fourth node.

In some embodiments of the present disclosure, the differential diode-connected transistor includes a fifth transistor and a sixth transistor. A second electrode of the fifth transistor is coupled to a control electrode of the fifth transistor and the third node, and a first electrode of the fifth transistor is coupled to a second voltage terminal. A second electrode of the sixth transistor is coupled to a control electrode of the sixth transistor and the fourth node, and a first electrode of the sixth transistor is coupled to the second voltage terminal.

In some embodiments of the present disclosure, the differential diode-connected transistor further includes a seventh transistor and an eighth transistor. A control electrode of the seventh transistor is coupled to the control electrode of the fifth transistor, a first electrode of the seventh transistor is coupled to the second voltage terminal, and a second electrode of the seventh transistor is coupled to the second electrode of the sixth transistor. A control electrode of the eighth transistor is coupled to the control electrode of the sixth transistor, a first electrode of the eighth transistor is coupled to the second voltage terminal, and a second electrode of the eighth transistor is coupled to the second electrode of the fifth transistor.

In some embodiments of the present disclosure, the amplifier circuit further includes a second current source circuit. The second current source circuit is coupled to the current mirror and the load circuit, and is configured to provide a second constant current to the load circuit.

In some embodiments of the present disclosure, the second current source circuit includes a ninth transistor and a tenth transistor. A control electrode of the ninth transistor is coupled to a second bias voltage terminal, a first electrode of the ninth transistor is coupled to a second voltage terminal, and a second electrode of the ninth transistor is coupled to the third node. A control electrode of the tenth transistor is coupled to the second bias voltage terminal, a first electrode of the tenth transistor is coupled to the second voltage terminal, and a second electrode of the tenth transistor is coupled to the fourth node.

In some embodiments of the present disclosure, the first current source circuit includes an eleventh transistor. A control electrode of the eleventh transistor is coupled to a first bias voltage terminal, a first electrode of the eleventh transistor is coupled to a second voltage terminal, and a second electrode of the eleventh transistor is coupled to the pre-amplifier circuit.

In some embodiments of the present disclosure, the pre-amplifier circuit includes a twelfth transistor and a thirteenth transistor. A control electrode of the twelfth transistor is coupled to the first input terminal, a first electrode of the twelfth transistor is coupled to the first current source circuit, and a second electrode of the twelfth transistor is coupled to the first node. A control electrode of the thirteenth transistor is coupled to the second input terminal, a first electrode of the thirteenth transistor is coupled to a first electrode of the twelfth transistor, and a second electrode of the thirteenth transistor is coupled to the second node.

In some embodiments of the present disclosure, the comparison circuit includes a fourteenth transistor, a fifteenth transistor, a sixteenth transistor, and a seventeenth transistor. A control electrode of the fourteenth transistor is coupled to the fourth node, a first electrode of the fourteenth transistor is coupled to a first voltage terminal, and a second electrode of the fourteenth transistor is coupled to a second electrode of the sixteenth transistor. A control electrode of the fifteenth transistor is coupled to the third node, a first electrode of the fifteenth transistor is coupled to the first voltage terminal, and a second electrode of the fifteenth transistor is coupled to the fifth node. A first electrode of the sixteenth transistor is coupled to a second voltage terminal, and a control electrode of the sixteenth transistor is coupled to the second electrode of the sixteenth transistor. A control electrode of the seventeenth transistor is coupled to the control electrode of the sixteenth transistor, a first electrode of the seventeenth transistor is coupled to the second voltage terminal, and a second electrode of the seventeenth transistor is coupled to the fifth node.

In some embodiments of the present disclosure, the output circuit includes an eighteenth transistor and a nineteenth transistor. A control electrode of the eighteenth transistor is coupled to the fifth node, a first electrode of the eighteenth transistor is coupled to a first voltage terminal, and a second electrode of the eighteenth transistor is coupled to a signal output terminal. A control electrode of the nineteenth transistor is coupled to the fifth node, a first electrode of the nineteenth transistor is coupled to a second voltage terminal, and a second electrode of the nineteenth transistor is coupled to the signal output terminal.

In some embodiments of the present disclosure, a ratio of the first constant current and the second constant current is greater than two.

A second aspect of the present disclosure provides a comparator. The comparator includes first to eighth transistors and eleventh to nineteenth transistors. A second electrode of the first transistor is coupled to a control electrode of the first transistor and a first node, and a first electrode of the first transistor is coupled to a first voltage terminal. A second electrode of the second transistor is coupled to a control electrode of the second transistor and a second node, and a first electrode of the second transistor is coupled to the first voltage terminal. A control electrode of the third transistor is coupled to the control electrode of the first transistor, a first electrode of the third transistor is coupled to the first voltage terminal, and a second electrode of the third transistor is coupled to a third node. A control electrode of the fourth transistor is coupled to the control electrode of the second transistor, a first electrode of the fourth transistor is coupled to the first voltage terminal, and a second electrode of the fourth transistor is coupled to the fourth node. A second electrode of the fifth transistor is coupled to a control electrode of the fifth transistor and the third node, and the first electrode of the fifth transistor is coupled to a second voltage terminal. A second electrode of the sixth transistor is coupled to a control electrode of the sixth transistor and the fourth node, and a first electrode of the sixth transistor is coupled to the second voltage terminal. A control electrode of the seventh transistor is coupled to the control electrode of the fifth transistor, a first electrode of the seventh transistor is coupled to the second voltage terminal, and a second electrode of the seventh transistor is coupled to the second electrode of the sixth transistor. A control electrode of the eighth transistor is coupled to the control electrode of the sixth transistor, a first electrode of the eighth transistor is coupled to the second voltage terminal, and a second electrode of the eighth transistor is coupled to the second electrode of the fifth transistor. A control electrode of the eleventh transistor is coupled to a first bias voltage terminal, a first electrode of the eleventh transistor is coupled to the second voltage terminal, and a second electrode of the eleventh transistor is coupled to a first electrode of the twelfth transistor and a first electrode of the thirteenth transistor. A control electrode of the twelfth transistor is coupled to the first input terminal, and a second electrode of the twelfth transistor is coupled to the first node. A control electrode of the thirteenth transistor is coupled to the second input terminal, and a second electrode of the thirteenth transistor is coupled to the second node. A control electrode of a fourteenth transistor is coupled to the fourth node, a first electrode of the fourteenth transistor is coupled to the first voltage terminal, and a second electrode of the fourteenth transistor is coupled to a second electrode of the sixteenth transistor. A control electrode of the fifteenth transistor is coupled to the third node, a first electrode of the fifteenth transistor is coupled to the first voltage terminal, and a second electrode of the fifteenth transistor is coupled to a fifth node. A first electrode of the sixteenth transistor is coupled to the second voltage terminal, and a control electrode of the sixteenth transistor is coupled to a second electrode of the sixteenth transistor. A control electrode of the seventeenth transistor is coupled to the control electrode of the sixteenth transistor, a first electrode of the seventeenth transistor is coupled to the second voltage terminal, and a second electrode of the seventeenth transistor is coupled to the fifth node. A control electrode of the eighteenth transistor is coupled to the fifth node, a first electrode of the eighteenth transistor is coupled to the first voltage terminal, and a second electrode of the eighteenth transistor is coupled to a signal output terminal. A control electrode of the nineteenth transistor is coupled to the fifth node, a first electrode of the nineteenth transistor is coupled to the second voltage terminal, and a second electrode of the nineteenth transistor is coupled to the signal output terminal.

In some embodiments of the present disclosure, the comparator further includes a ninth transistor and a tenth transistor. A control electrode of the ninth transistor is coupled to a second bias voltage terminal, a first electrode of the ninth transistor is coupled to the second voltage terminal, and a second electrode of the ninth transistor is coupled to the third node. A control electrode of the tenth transistor is coupled to the second bias voltage terminal, a first electrode of the tenth transistor is coupled to the second voltage terminal, and a second electrode of the tenth transistor is coupled to the fourth node.

A third aspect of the present disclosure provides an analog-to-digital converter including a comparator according to the first and second aspects of the present disclosure.

BRIEF DESCRIPTION OF THE DRAWINGS

To describe technical solutions of the embodiments of the present disclosure more clearly, the accompanying drawings of the embodiments will be briefly introduced in the following. It should be known that the accompanying drawings in the following description merely involve some embodiments of the present disclosure, but do not limit the present disclosure, in which.

In the drawings, the reference numbers having the same last two-digit correspond to the same elements. It should be noted that the elements in the drawings are schematic and not drawn to scale.

DETAILED DESCRIPTION

Figure 1:
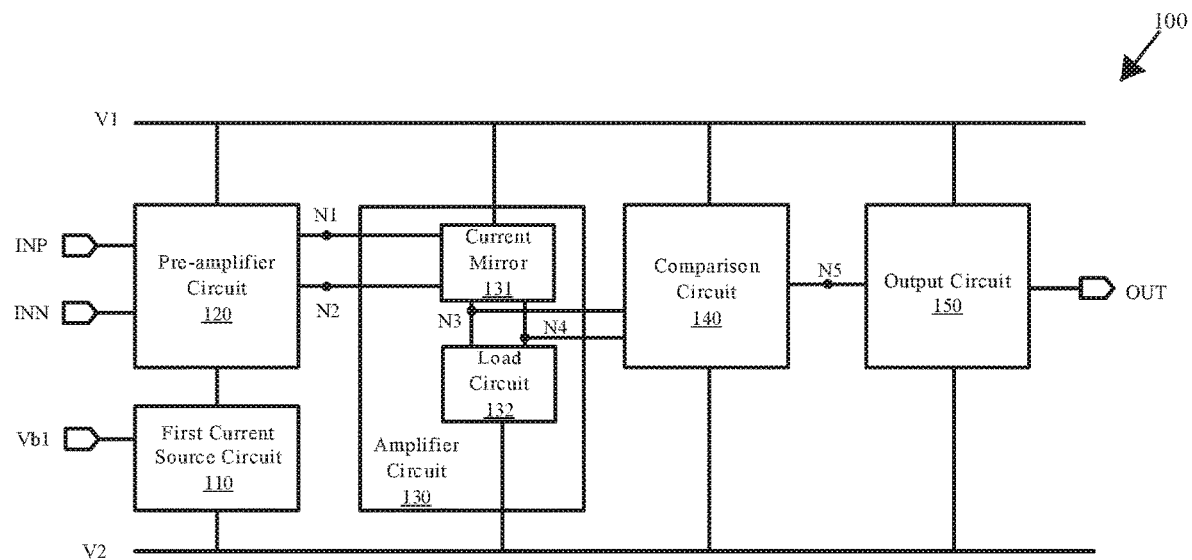
FIG. 1 is a schematic block diagram of a comparator according to an embodiment of the present disclosure.

To make the technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protecting scope of the present disclosure.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all the embodiments of the present disclosure, a source and a drain (an emitter and a collector) of a transistor are symmetrical, and a current from the source to the drain (from the emitter to the collector) to turn on an N-type transistor is in an opposite direction with respect to the current from the source to the drain (from the emitter and the collector) to turn on an a P-type transistor. Therefore, in the embodiments of the present disclosure, a controlled intermediate terminal of the transistor is referred to as a control electrode, and the remaining two terminals are referred to as a first electrode and a second electrode. In addition, terms such as "first" and "second" are only used to distinguish one element (or a part of the element) from another element (or another part of this element).

The comparators currently under study mainly include multi-stage open-loop comparators, switch capacitor comparators, and dynamic latched regenerative comparators. The multi-stage open-loop comparator has higher accuracy, but it is difficult to improve the response speed due to the bandwidth limitation of the multi-stage amplifier. The switch capacitor comparator can use offset cancellation techniques to eliminate offset voltages to improve accuracy. However, the switch capacitor comparator has serious charge injection and clock feedthrough effects. This makes it difficult to design a switch capacitor comparator. The dynamic latched regenerative comparator has a fast response time, but has high kick-back noise and offset voltage, which is not suitable for high-precision systems. For this reason, a comparator having high accuracy (low offset voltage) and high speed is desired.

Embodiments of the present disclosure provide a comparator having high accuracy. FIG. 1 illustrates a schematic block diagram of a comparator 100 according to an embodiment of the present disclosure. As shown in FIG. 1, the comparator 100 includes a first current source circuit 110, a pre-amplifier circuit 120, an amplifier circuit 130, a comparison circuit 140, and an output circuit 150.

The first current source circuit 110 may be coupled to the pre-amplifier circuit 120, a second voltage terminal V2, and a first bias voltage terminal Vb1. The first current source circuit 110 may be configured to provide a first constant current to the pre-amplifier circuit 120. The first constant current can be used to maintain a constant total current passing through the pre-amplifier circuit 120.

The pre-amplifier circuit 120 may be coupled to the first current source circuit 110, the amplifier circuit 130, a first voltage terminal V1, a first input terminal INP, and a second input terminal INN. The pre-amplifier circuit 120 may be configured to amplify a first input signal from a first input terminal INP into a first pre-amplified signal based on the first constant current and provide the first pre-amplified signal to the amplifier circuit 130 via the first node N1, and amplify a second input signal from a second input terminal INN into a second pre-amplified signal based on the first constant current and provide the second pre-amplified signal to the amplifier circuit 130 via the second node N2.

The amplifier circuit 130 may include a current mirror 131 and a load circuit 132. The current mirror 131 may be coupled to the pre-amplifier circuit 120, the comparison circuit 140, the load circuit 132, and the first voltage terminal V1. The load circuit 132 may be coupled to the current mirror 131, the comparison circuit 140, and the second voltage terminal V2. The load circuit 132 may include a differential diode-connected transistor. Since the differential diode-connected transistor has a high impedance value, the load circuit 132 including such a transistor has a high impedance value, so that the amplifier circuit 130 has a higher gain. The amplifier circuit 130 may be configured to generate a first mirror signal of the first pre-amplified signal and a second mirror signal of the second pre-amplified signal by the current mirror 131, generate a first amplified signal by the load circuit 132 based on the first mirror signal and provide the first amplified signal to the comparison circuit 140 via the third node N3, and generate a second amplified signal by the load circuit 132 based on the second mirror signal and provide the second amplified signal to the comparison circuit 140 via the fourth node N4.

The comparison circuit 140 may be coupled to the amplifier circuit 130, the output circuit 150, the first voltage terminal V1, and the second voltage terminal V2. The comparison circuit 140 may be configured to compare the first amplified signal with the second amplified signal, and provide a result of the comparison to the output circuit 150 via the fifth node N5.

The output circuit 150 may be coupled to the comparison circuit 140, the first voltage terminal V1, the second voltage terminal V2, and a signal output terminal OUT. The output circuit 150 may be configured to output from the signal output terminal OUT either a first voltage V1 or a second voltage V2 based on the result of the comparison. For example, the first voltage V1 is at a high level, and the second voltage V2 is at a low level.

The comparator 100 according to an embodiment of the present disclosure amplifies a voltage difference between the first input signal and the second input signal by amplifying the first input signal and the second input signal. Since the amplifier circuit 130 uses a differential diode-connected transistor having a high impedance value as a load, the amplifier circuit 130 can obtain a high gain. In this way, even if the voltage difference between the first input signal and the second input signal is small, the voltage difference between the first amplified signal and the second amplified signal can be large enough, so that which of the first input signal and the second input signal is larger can be determined accurately. Therefore, the offset of the comparator 100 according to the embodiment of the present disclosure is small. In addition, since the pre-amplification circuit 120 and the amplification circuit 130 are connected through the current mirror 131, the poles in the comparator 100 are not increased. Since the comparator 100 has a high gain and fewer poles, the comparator 100 has a large bandwidth and thus a high operating frequency. Therefore, the embodiment of the present disclosure realizes a comparator having low offset and high-speed.

Figure 2:
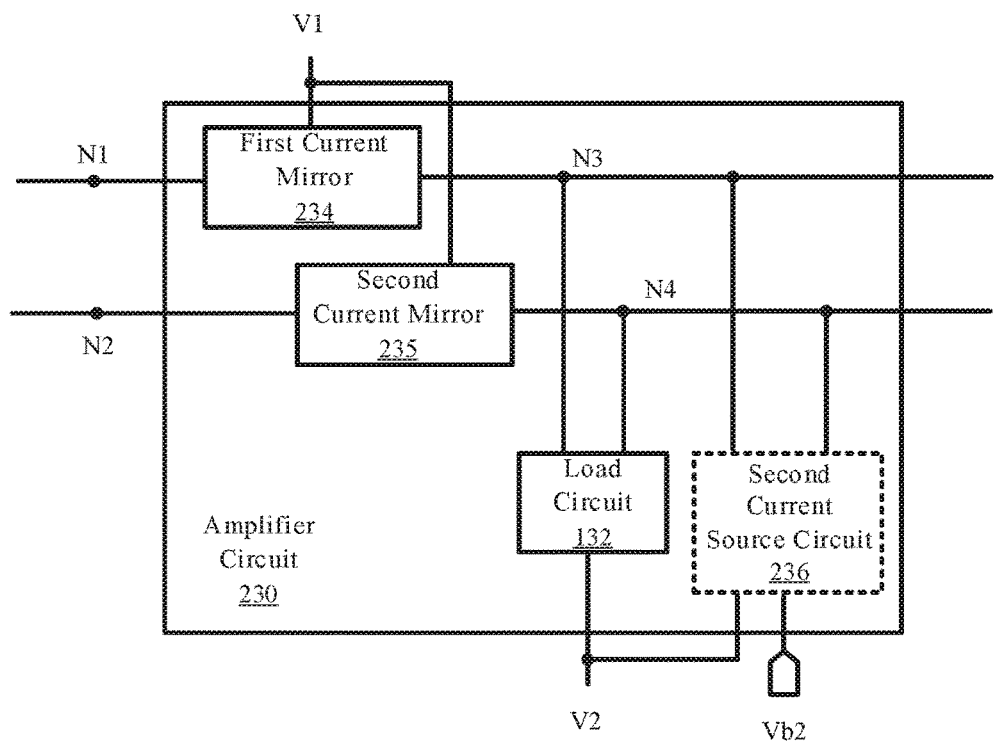
FIG. 2 is a schematic block diagram of an amplifier of the comparator according to an embodiment of the present disclosure.

FIG. 2 shows a schematic block diagram of the amplifier circuit 230 of the comparator 100 according to an embodiment of the present disclosure. As shown in FIG. 2, the amplifier circuit 230 may include a first current mirror 234, a second current mirror 235, and a load circuit 132. The first current mirror 234 and the second current mirror 235 constitute a current mirror 131 shown in FIG. 1. The first current mirror 234 is coupled to the first node N1, a first voltage terminal V1, the load circuit 132, and the third node N3. The first current mirror 234 may be configured to generate the first mirror signal based on the first pre-amplified signal, and provide the first mirror signal to the third node N3. The second current mirror 235 is coupled to the second node N2, the first voltage terminal V1, the load circuit 132, and the fourth node N4. The second current mirror 235 may be configured to generate the second mirror signal based on the second pre-amplified signal, and provide the second mirror signal to the fourth node N4.

Further, in some embodiments of the present disclosure, the amplifier circuit 130 further includes a second current source circuit 236. The second current source circuit 236 is coupled to the first current mirror 234, the second current mirror 235, and the load circuit 132, and may be configured to provide a second constant current to the load circuit 132. In an embodiment of the present disclosure, a ratio of the first constant current and the second constant current is N: 1, where N>2. By setting the flow direction of the second constant current, the current flowing through the load circuit 132 shown in FIG. 2 may be (0.5N−1)/0.5N of the current flowing through the load circuit 132 shown in FIG. 1. For example, if N is 2.5, the current flowing through the load circuit 132 shown in FIG. 2 is ⅕ of the current flowing through the load circuit 132 shown in FIG. 1. In this way, the gain of the amplifier circuit 230 shown in FIG. 2 will become 5 times the gain of the amplifier circuit 130 shown in FIG. 1. Since the gain of the amplification circuit 230 becomes larger, even if the voltage difference between the first input signal and the second input signal is small, the voltage difference between the first amplified signal and the second amplified signal can be large enough, so that which of the first input signal and the second input signal is larger can be determined accurately. Therefore, the offset of the comparator 100 according to this embodiment is smaller.

Figure 3:
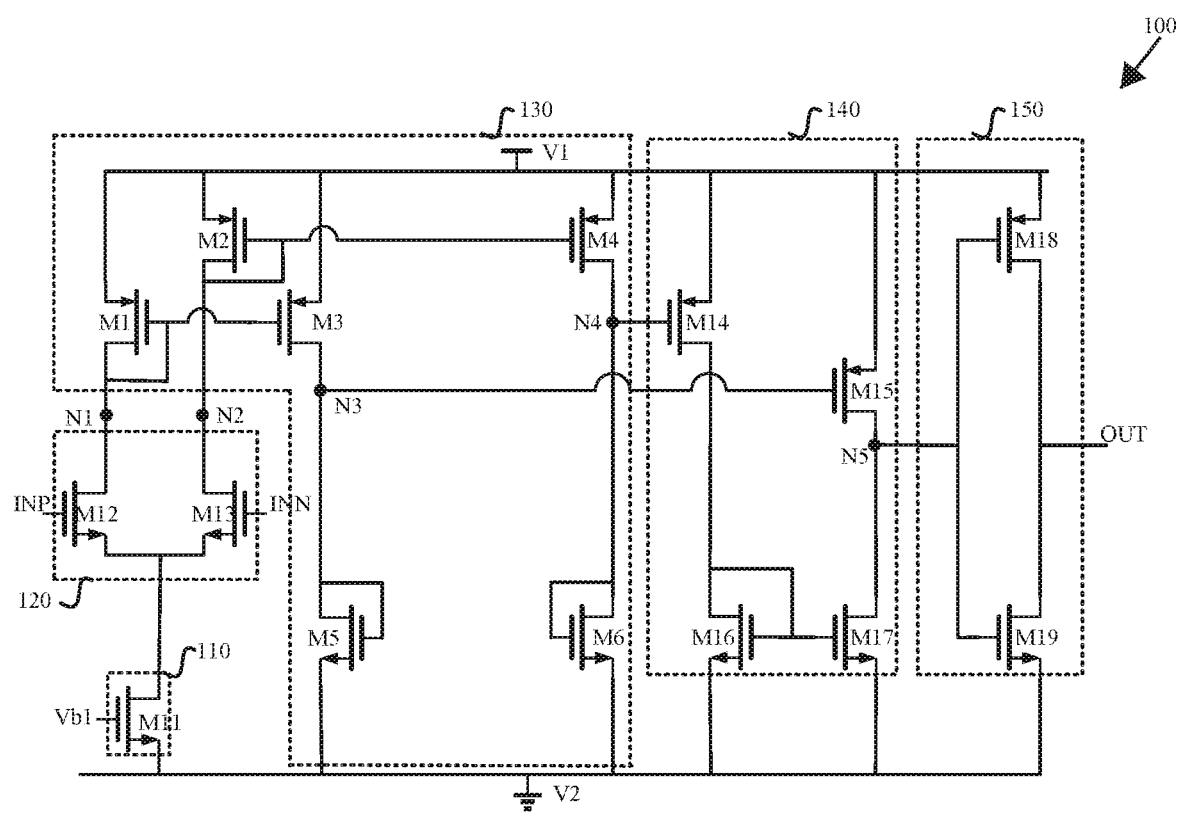
FIG. 3 is an example circuit diagram of the comparator according to an embodiment of the present disclosure.

FIG. 3 shows an exemplary circuit diagram of the comparator 100 according to an embodiment of the present disclosure. As shown in FIG. 3, the amplifier circuit 130 may include first to sixth transistors (M1-M6). The first transistor M1 and the third transistor M3 constitute the first current mirror 234. The second transistor M2 and the fourth transistor M4 constitute the second current mirror 235. The fifth transistor M5 and the sixth transistor M6 constitute the differential diode-connected transistor, as the load circuit 132. A second electrode of the first transistor M1 is coupled to a control electrode of the first transistor M1 and the first node N1. A first electrode of the first transistor M1 is coupled to the first voltage terminal V1. A second electrode of the second transistor M2 is coupled to a control electrode of the second transistor M2 and the second node N2. A first electrode of the second transistor M2 is coupled to the first voltage terminal V1. A control electrode of the third transistor M3 is coupled to the control electrode of the first transistor M1. A first electrode of the third transistor M3 is coupled to the first voltage terminal V1. A second electrode of the third transistor M3 is coupled to the third node N3. A control electrode of the fourth transistor M4 is coupled to the control electrode of the second transistor M2. A first electrode of the fourth transistor M4 is coupled to the first voltage terminal V1. A second electrode of the fourth transistor M4 is coupled to the fourth node N4. A second electrode of the fifth transistor M5 is coupled to a control electrode of the fifth transistor M5 and the third node N3. A first electrode of the fifth transistor M5 is coupled to the second voltage terminal V2. A second electrode of the sixth transistor M6 is coupled to a control electrode of the sixth transistor M6 and the fourth node N4, and a first electrode of the sixth transistor M6 is coupled to the second voltage terminal V2.

The first current source circuit 110 may include an eleventh transistor M11. A control electrode of the eleventh transistor M11 is coupled to a first bias voltage terminal Vb1. A first electrode of the eleventh transistor M11 is coupled to the second voltage terminal V2. A second electrode of the eleventh transistor M11 is coupled to the pre-amplifier circuit 120.

The pre-amplifier circuit 120 may include a twelfth transistor M12 and a thirteenth transistor M13. A control electrode of the twelfth transistor M12 is coupled to the first input terminal INP. A first electrode of the twelfth transistor M12 is coupled to the second electrode of the eleventh transistor M11. A second electrode of the twelfth transistor M12 is coupled to the first node N1. A control electrode of the thirteenth transistor M13 is coupled to the second input terminal INN. A first electrode of the thirteenth transistor M13 is coupled to a first electrode of the twelfth transistor M12. A second electrode of the thirteenth transistor M13 is coupled to the second node N2.

The comparison circuit 140 may include a fourteenth transistor M14, a fifteenth transistor M15, a sixteenth transistor M16, and a seventeenth transistor M17. A control electrode of the fourteenth transistor M14 is coupled to the fourth node N4. A first electrode of the fourteenth transistor M14 is coupled to a first voltage terminal V1. A second electrode of the fourteenth transistor M14 is coupled to a second electrode of the sixteenth transistor M16. A control electrode of the fifteenth transistor M15 is coupled to the third node N3. A first electrode of the fifteenth transistor M15 is coupled to the first voltage terminal V1. A second electrode of the fifteenth transistor M15 is coupled to the fifth node N5. A first electrode of the sixteenth transistor M16 is coupled to a second voltage terminal V2. A control electrode of the sixteenth transistor M16 is coupled to the second electrode of the sixteenth transistor M16. A control electrode of the seventeenth transistor M17 is coupled to the control electrode of the sixteenth transistor M16. A first electrode of the seventeenth transistor M17 is coupled to the second voltage terminal V2. A second electrode of the seventeenth transistor M17 is coupled to the fifth node N5.

The output circuit 150 may include an eighteenth transistor M18 and a nineteenth transistor M19. A control electrode of the eighteenth transistor M18 is coupled to the fifth node N5. A first electrode of the eighteenth transistor M18 is coupled to a first voltage terminal V1. A second electrode of the eighteenth transistor M18 is coupled to a signal output terminal OUT. A control electrode of the nineteenth transistor M19 is coupled to the fifth node N5. A first electrode of the nineteenth transistor M19 is coupled to a second voltage terminal V2. A second electrode of the nineteenth transistor M19 is coupled to the signal output terminal OUT.

In the embodiment shown in FIG. 3, the first to fourth transistors (M1-M4), the fourteenth transistor M14, the fifteenth transistor M15, and the eighteenth transistor M18 are P-type transistors. The fifth transistor M5, the sixth transistor M6, the eleventh to thirteenth transistors (M11-M13), the sixteenth transistor M16, the seventeenth transistor M17, and the nineteenth transistor M19 are N-type transistors.

During the operation of the comparator 100, the first bias voltage Vb1 is provided to the control electrode of the eleventh transistor M11. In this way, the first constant current can be output from the second electrode of the eleventh transistor M11. The amplitude of the first constant current can be adjusted by setting the width-to-length ratio of the eleventh transistor M11.

In this embodiment, the first input signal and the second input signal are voltage signals. The first input signal is provided to the control electrode of the twelfth transistor M12. The twelfth transistor M12 amplifies the first input signal into the first pre-amplified signal and provides the first pre-amplified signal to the second electrode of the first transistor M1 via the first node N1. The second input signal is provided to the control electrode of the thirteenth transistor M13. The thirteenth transistor M13 amplifies the second input signal into the second pre-amplified signal and provides the second pre-amplified signal to the second electrode of the second transistor M2 via the second node N2. Here, the first pre-amplified signal and the second pre-amplified signal are current signals. The sum of the first pre-amplified signal and the second pre-amplified signal is equal to the first constant current.

In the amplifier circuit 130, the first current mirror 234 generates the first mirror signal at the second electrode of the third transistor M3 based on the first pre-amplified signal, and provides the first mirror signal to the third node N3. The second current mirror 235 generates the second mirror signal at the second electrode of the fourth transistor M4 based on the second pre-amplified signal, and provides the second mirror signal to the fourth node N4. Here, the first mirror signal and the second mirror signal are current signals.

Although the third node N3 is coupled to the control electrode of the fifteenth transistor M15, the current flowing to the control electrode of the fifteenth transistor M15 is relatively small and can be ignored. Therefore, it can be considered that the first mirror signal is all supplied to the second electrode of the fifth transistor M5. Since the third node N3 is coupled to the fifth transistor M5 as a load, a voltage signal (which is referred to as a "first amplified signal" in the context) corresponding to the first mirror signal is generated at the third node N3. This voltage signal is inversely proportional to the transconductance of the fifth transistor M5. Similarly, although the fourth node N4 is coupled to the control electrode of the fourteenth transistor M14, the current flowing to the control electrode of the fourteenth transistor M14 is relatively small and can be ignored. Therefore, it can be considered that the second mirror signal is all supplied to the second electrode of the sixth transistor M6. Since the fourth node N4 is coupled to the sixth transistor M6 as a load, a voltage signal corresponding to the second mirror signal is generated at the fourth node N4 (which is referred to as a "second amplified signal" in the context). This voltage signal is inversely proportional to the transconductance of the sixth transistor M6.

In the comparison circuit 140, the first amplified signal enables the fifteenth transistor M15. The current flowing through the fifteenth transistor M15 generates a voltage signal at the fifth node N5, as a first comparison signal. The second amplified signal enables the fourteenth transistor M14. The current flowing through the fourteenth transistor M14 is mirrored to the second electrode of the seventeenth transistor M17 by a current mirror formed by the sixteenth transistor M16 and the seventeenth transistor M17, thereby generating another voltage signal at the fifth node N5, as second comparison signal.

If the first input signal is larger than the second input signal, the first pre-amplified signal is larger than the second pre-amplified signal. Therefore, the first amplified signal is larger than the second amplified signal. Consequently, the first comparison signal is larger than the second comparison signal, so that a positive voltage is generated at the fifth node N5. The positive voltage causes the nineteenth transistor M19 to be enabled and the eighteenth transistor M18 to be disabled, thereby outputting the second voltage V2 at the output signal terminal OUT.

If the first input signal is smaller than the second input signal, the first pre-amplified signal is smaller than the second pre-amplified signal. Therefore, the first amplified signal is smaller than the second amplified signal. Consequently, the first comparison signal is smaller than the second comparison signal, so that a negative voltage is generated at the fifth node N5. The negative voltage causes the eighteenth transistor M18 to be enabled and the nineteenth transistor M19 to be disabled, thereby outputting the first voltage V1 at the output signal terminal OUT.

Figure 4:
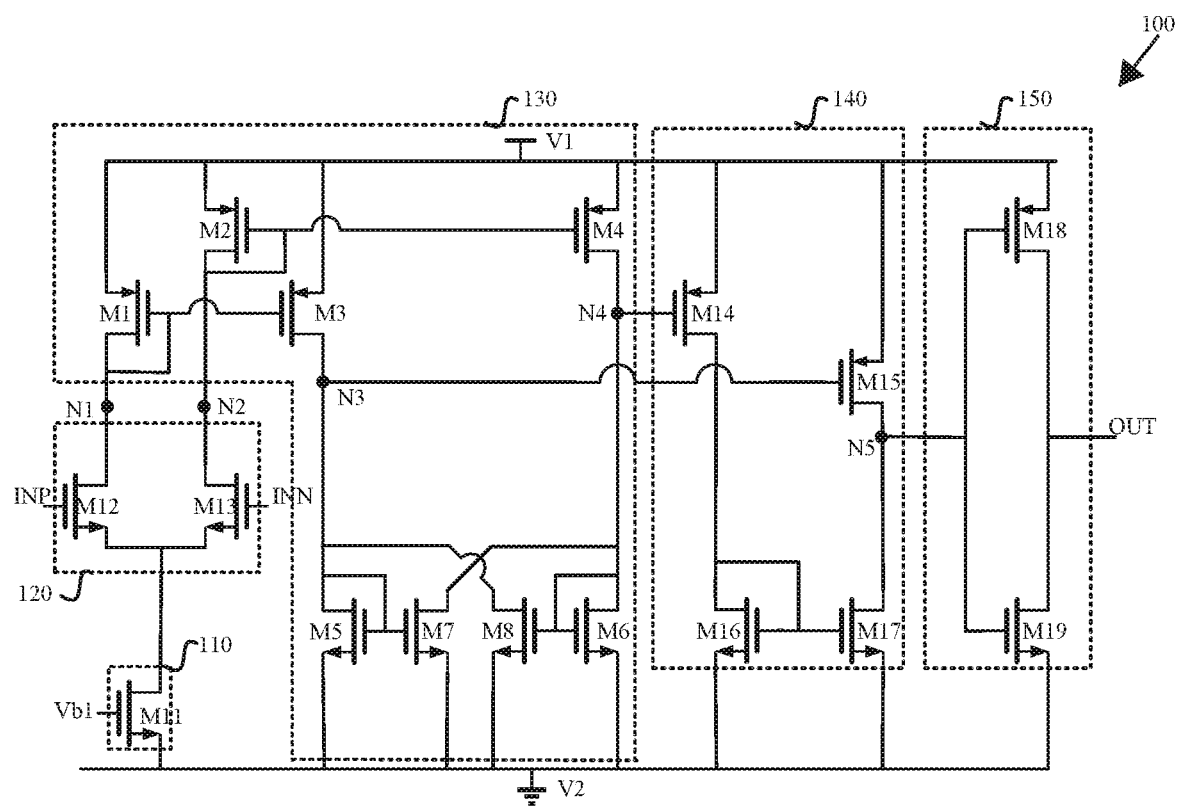
FIG. 4 is an example circuit diagram of the comparator according to another embodiment of the present disclosure.

FIG. 4 shows an exemplary circuit diagram of the comparator according to another embodiment of the present disclosure. Different from the comparator shown in FIG. 3, in this embodiment, the amplifier circuit 130 further includes a seventh transistor M7 and an eighth transistor M8. The seventh transistor M7 and the eighth transistor M8 constitute another differential diode-connected transistor, and are coupled to the differential diode-connected transistor composed of the fifth transistor M5 and the sixth transistor M6 to collectively constitute the load circuit 132. In this embodiment, the seventh transistor M7 and the eighth transistor M8 are N-type transistors. A control electrode of the seventh transistor M7 is coupled to the control electrode of the fifth transistor M5. A first electrode of the seventh transistor M7 is coupled to the second voltage terminal V2. A second electrode of the seventh transistor M7 is coupled to the second electrode of the sixth transistor M6. A control electrode of the eighth transistor M8 is coupled to the control electrode of the sixth transistor M6. A first electrode of the eighth transistor M8 is coupled to the second voltage terminal V2. A second electrode of the eighth transistor M8 is coupled to the second electrode of the fifth transistor M5.

Compared with FIG. 3, the impedance value of the load of the amplifier circuit 130 shown in FIG. 4 is larger, and therefore, the amplifier circuit 130 has a larger gain. Thus, even if the voltage difference between the first input signal and the second input signal is very small, the voltage difference between the first amplified signal and the second amplified signal can be large enough, so that which of the first input signal and the second input signal is larger can be determined accurately. Therefore, compared with FIG. 3, the offset of the comparator 100 shown in FIG. 4 is smaller.

Figure 5:
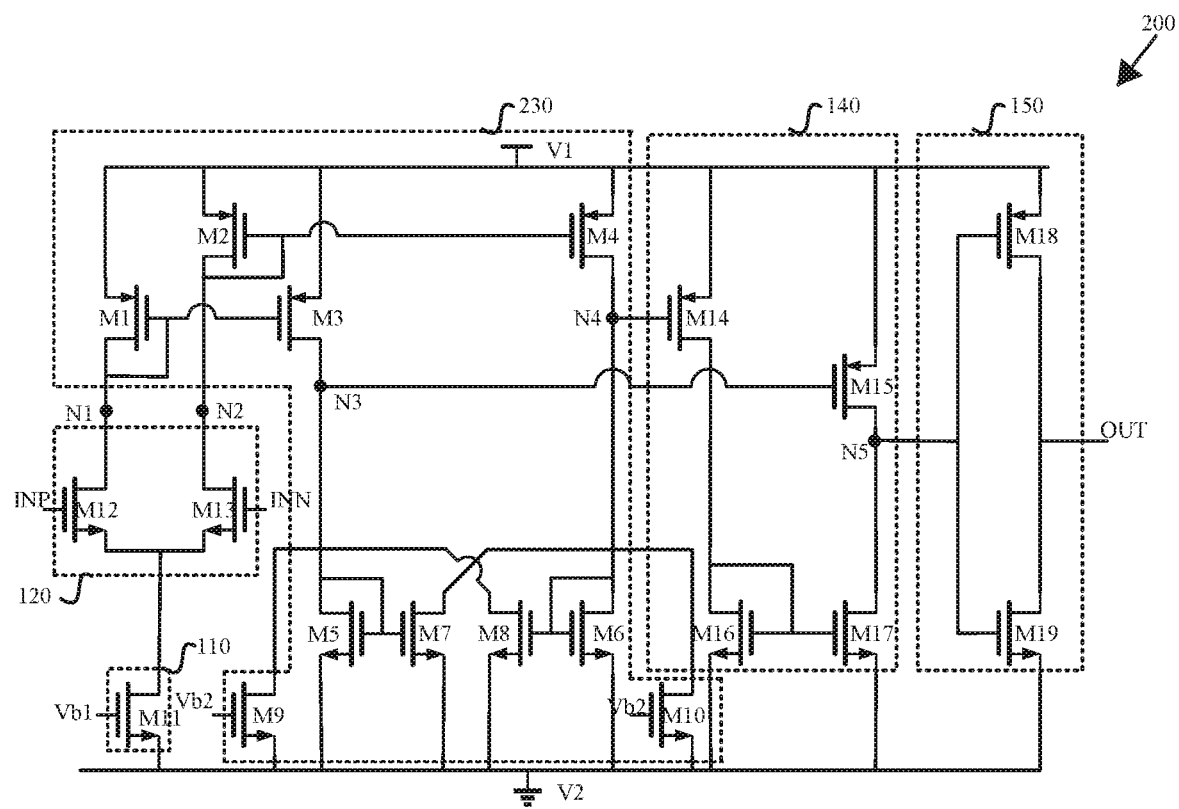
FIG. 5 is an example circuit diagram of the comparator according to still another embodiment of the present disclosure.

FIG. 5 shows an exemplary circuit diagram of the comparator according to still another embodiment of the present disclosure. In this embodiment, the amplifier circuit 230 may further include a ninth transistor M9 and a tenth transistor M10. The ninth transistor M9 and the tenth transistor M10 constitute the second current source circuit 236. In this embodiment, the ninth transistor M9 and the tenth transistor M10 are N-type transistors. A control electrode of the ninth transistor M9 is coupled to a second bias voltage terminal Vb2. A first electrode of the ninth transistor M9 is coupled to a second voltage terminal V2. A second electrode of the ninth transistor M9 is coupled to the third node N3. A control electrode of the tenth transistor M10 is coupled to the second bias voltage terminal Vb2. A first electrode of the tenth transistor M10 is coupled to the second voltage terminal V2. A second electrode of the tenth transistor M10 is coupled to the fourth node N4.

In the embodiments of the present disclosure, the first bias voltage terminal Vb1 provides a first bias voltage Vb1. The second bias voltage terminal Vb2 provides a second bias voltage Vb2. In some embodiments of the present disclosure, the ratio of the first constant current and the second constant current may be set to N: 1, by setting a ratio of the first bias voltage Vb1 and the second bias voltage Vb2. In other embodiments of the present disclosure, the second bias voltage Vb2 may be equal to the first bias voltage Vb1. By setting the width-to-length ratio of the ninth transistor M9 and the tenth transistor M10, the ratio of the first constant current and the second constant current can be set to N: 1.

By setting the flow direction of the second constant current, the current flowing through the load circuit 132 can be reduced, so the transconductances of the transistors in the load circuit are reduced. Therefore, the impedance of the load circuit is increased, so that the gain of the amplifier circuit is increased. Therefore, the offset of the comparator shown in FIG. 5 is reduced.

Those skilled in the art should understand that adaptive modifications to the types of transistors in the above embodiments will also fall within the protection scope of the present disclosure.

Figure 6:
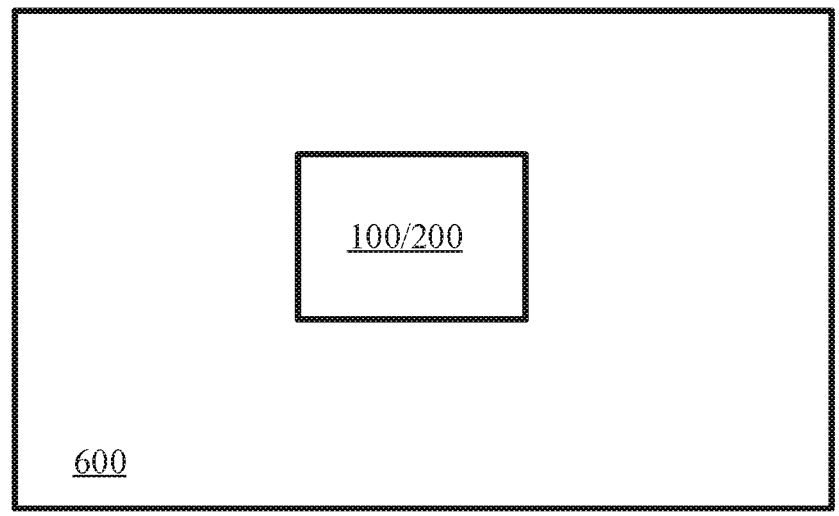
FIG. 6 is a schematic block diagram of an analog-to-digital converter according to an embodiment of the present disclosure.

FIG. 6 shows a schematic block diagram of an analog-to-digital converter 600 according to an embodiment of the present disclosure. As shown in FIG. 6, the analog-to-digital converter 600 may include one or more comparators (100, 200) as shown in any one of FIGS. 1-5. In an embodiment, the analog-to-digital converter may include a comparator. The comparator receives an analog signal via a first input terminal, and receives a reference signal via a second input terminal. If the amplitude of the analog signal is greater than or equal to the amplitude of the reference signal, the comparator outputs a logic "1" as the digital signal corresponding to the analog signal. If the amplitude of the analog signal is lower than the amplitude of the reference signal, the comparator outputs a logic "0". In another embodiment, the analog-to-digital converter may include multiple comparators to convert an analog signal into a multi-bit digital signal. The accuracy of the analog-to-digital converter 600 may depend on the number of comparators included in the analog-to-digital converter 600.

In addition, the analog-to-digital converter 600 may be applied to a protection circuit of a display device, such as an over-voltage protection circuit or an over-current protection circuit. In one embodiment, the overvoltage protection circuit may include an analog-to-digital converter 600 and a detection circuit. The voltage inputted to the display device is converted into a digital signal and supplied to a detection circuit, by the analog-to-digital converter 600. The detection circuit detects whether the digital signal exceeds a threshold value, and activates over-voltage protection of the display device when the digital signal exceeds the threshold value. The display device can be applied to any product with a display function, for example, among others, electronic paper, mobile phone, tablet computer, television, notebook computer, digital photo frame, wearable device, or navigator.

As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted as inclusively rather than exclusively. Likewise, the terms "include" and "or" should be construed to be inclusive, unless such an interpretation is clearly prohibited from the context. Where used herein the term "examples," particularly when followed by a listing of terms is merely exemplary and illustrative, and should not be deemed to be exclusive or comprehensive.

Further adaptive aspects and scopes become apparent from the description provided herein. It should be understood that various aspects of the present disclosure may be implemented separately or in combination with one or more other aspects. It should also be understood that the description and specific embodiments in the present disclosure are intended to describe rather than limit the scope of the present disclosure.

A plurality of embodiments of the present disclosure has been described in detail above. However, apparently those skilled in the art may make various modifications and variations on the embodiments of the present disclosure without departing from the spirit and scope of the present disclosure. The scope of protecting of the present disclosure is limited by the appended claims.

What is claimed is:

1. A comparator comprising a first current source circuit, a pre-amplifier circuit, an amplifier circuit, a comparison circuit, and an output circuit;
   wherein the first current source circuit is coupled to the pre-amplifier circuit, and is configured to provide a first constant current to the pre-amplifier circuit;
   wherein the pre-amplifier circuit is coupled to the amplifier circuit via a first node and a second node, and is configured to amplify a first input signal from a first input terminal into a first pre-amplified signal, amplify a second input signal from a second input terminal into a second pre-amplified signal based on the first constant current, and provide the first pre-amplified signal and the second pre-amplified signal to the amplifier circuit via the first node and the second node respectively;
   wherein the amplifier circuit is coupled to the comparison circuit via a third node and a fourth node, wherein the amplifier circuit comprises a current mirror and a load circuit, and is configured to generate a first mirror signal of the first pre-amplified signal and a second mirror signal of the second pre-amplified signal by the current mirror, generate a first amplified signal and a second amplified signal by the load circuit based on the first mirror signal and the second mirror signal respectively, and provide the first amplified signal and the second amplified signal to the comparison circuit via the third node and the fourth node respectively, and wherein the load circuit comprises a differential diode-connected transistor;
   wherein the comparison circuit is coupled to the output circuit via a fifth node, and is configured to compare the first amplified signal with the second amplified signal, and provide a result of the comparison to the output circuit via the fifth node; and
   wherein the output circuit is configured to output either a first voltage or a second voltage based on the result of the comparison.

2. The comparator according to claim 1, wherein the current mirror comprises a first current mirror and a second current mirror;
   wherein the first current mirror is coupled to the first node, a first voltage terminal, the load circuit, and the third node, and is configured to generate the first mirror signal based on the first pre-amplified signal, and provide the first mirror signal to the third node; and
   wherein the second current mirror is coupled to the second node, the first voltage terminal, the load circuit, and the fourth node, and is configured to generate the second mirror signal based on the second pre-amplified signal, and provide the second mirror signal to the fourth node.

3. The comparator according to claim 2, wherein the first current mirror comprises a first transistor and a third transistor, and wherein the second current mirror comprises a second transistor and a fourth transistor,
   wherein a second electrode of the first transistor is coupled to a control electrode of the first transistor and the first node, and wherein a first electrode of the first transistor is coupled to the first voltage terminal;
   wherein a second electrode of the second transistor is coupled to a control electrode of the second transistor and the second node, and wherein a first electrode of the second transistor is coupled to the first voltage terminal;
   wherein a control electrode of the third transistor is coupled to the control electrode of the first transistor, wherein a first electrode of the third transistor is coupled to the first voltage terminal, and wherein a second electrode of the third transistor is coupled to the third node; and
   wherein a control electrode of the fourth transistor is coupled to the control electrode of the second transistor, wherein a first electrode of the fourth transistor is coupled to the first voltage terminal, and wherein a second electrode of the fourth transistor is coupled to the fourth node.

4. The comparator according to claim 1, wherein the differential diode-connected transistor comprises a fifth transistor and a sixth transistor,
   wherein a second electrode of the fifth transistor is coupled to a control electrode of the fifth transistor and the third node, and wherein a first electrode of the fifth transistor is coupled to a second voltage terminal; and
   wherein a second electrode of the sixth transistor is coupled to a control electrode of the sixth transistor and the fourth node, and wherein a first electrode of the sixth transistor is coupled to the second voltage terminal.

5. The comparator according to claim 4, wherein the differential diode-connected transistor further comprises a seventh transistor and an eighth transistor,
   wherein a control electrode of the seventh transistor is coupled to the control electrode of the fifth transistor, wherein a first electrode of the seventh transistor is coupled to the second voltage terminal, and wherein a second electrode of the seventh transistor is coupled to the second electrode of the sixth transistor; and
   wherein a control electrode of the eighth transistor is coupled to the control electrode of the sixth transistor, wherein a first electrode of the eighth transistor is coupled to the second voltage terminal, and wherein a second electrode of the eighth transistor is coupled to the second electrode of the fifth transistor.

6. The comparator according to claim 1, wherein the amplifier circuit further comprises a second current source circuit, and wherein the second current source circuit is coupled to the current mirror and the load circuit, and is configured to provide a second constant current to the load circuit.

7. The comparator according to claim 6, wherein the second current source circuit comprises a ninth transistor and a tenth transistor,
   wherein a control electrode of the ninth transistor is coupled to a second bias voltage terminal, wherein a first electrode of the ninth transistor is coupled to a second voltage terminal, and wherein a second electrode of the ninth transistor is coupled to the third node; and
   wherein a control electrode of the tenth transistor is coupled to the second bias voltage terminal, wherein a first electrode of the tenth transistor is coupled to the second voltage terminal, and wherein a second electrode of the tenth transistor is coupled to the fourth node.

8. The comparator according to claim 1, wherein the first current source circuit comprises an eleventh transistor,
   wherein a control electrode of the eleventh transistor is coupled to a first bias voltage terminal, wherein a first electrode of the eleventh transistor is coupled to a second voltage terminal, and wherein a second electrode of the eleventh transistor is coupled to the pre-amplifier circuit.

9. The comparator according to claim 1, wherein the pre-amplifier circuit comprises a twelfth transistor and a thirteenth transistor,
wherein a control electrode of the twelfth transistor is coupled to the first input terminal, wherein a first electrode of the twelfth transistor is coupled to the first current source circuit, and wherein a second electrode of the twelfth transistor is coupled to the first node; and
wherein a control electrode of the thirteenth transistor is coupled to the second input terminal, wherein a first electrode of the thirteenth transistor is coupled to a first electrode of the twelfth transistor, and wherein a second electrode of the thirteenth transistor is coupled to the second node.

10. The comparator according claim 1, wherein the comparison circuit comprises a fourteenth transistor, a fifteenth transistor, a sixteenth transistor, and a seventeenth transistor,
wherein a control electrode of the fourteenth transistor is coupled to the fourth node, wherein a first electrode of the fourteenth transistor is coupled to a first voltage terminal, and wherein a second electrode of the fourteenth transistor is coupled to a second electrode of the sixteenth transistor;
wherein a control electrode of the fifteenth transistor is coupled to the third node, wherein a first electrode of the fifteenth transistor is coupled to the first voltage terminal, and wherein a second electrode of the fifteenth transistor is coupled to the fifth node;
wherein a first electrode of the sixteenth transistor is coupled to a second voltage terminal, and wherein a control electrode of the sixteenth transistor is coupled to the second electrode of the sixteenth transistor; and
wherein a control electrode of the seventeenth transistor is coupled to the control electrode of the sixteenth transistor, wherein a first electrode of the seventeenth transistor is coupled to the second voltage terminal, and wherein a second electrode of the seventeenth transistor is coupled to the fifth node.

11. The comparator according to claim 1, wherein the output circuit comprises an eighteenth transistor and a nineteenth transistor,
wherein a control electrode of the eighteenth transistor is coupled to the fifth node, wherein a first electrode of the eighteenth transistor is coupled to a first voltage terminal, and wherein a second electrode of the eighteenth transistor is coupled to a signal output terminal; and
wherein a control electrode of the nineteenth transistor is coupled to the fifth node, wherein a first electrode of the nineteenth transistor is coupled to a second voltage terminal, and wherein a second electrode of the nineteenth transistor is coupled to the signal output terminal.

12. The comparator according to claim 6, wherein a ratio of the first constant current and the second constant current is greater than two.

13. A comparator comprising first to eighth transistors and eleventh to nineteenth transistors;
wherein a second electrode of the first transistor is coupled to a control electrode of the first transistor and a first node, and wherein a first electrode of the first transistor is coupled to a first voltage terminal;
wherein a second electrode of the second transistor is coupled to a control electrode of the second transistor and a second node, and wherein a first electrode of the second transistor is coupled to the first voltage terminal;
wherein a control electrode of the third transistor is coupled to the control electrode of the first transistor, wherein a first electrode of the third transistor is coupled to the first voltage terminal, and wherein a second electrode of the third transistor is coupled to a third node;
wherein a control electrode of the fourth transistor is coupled to the control electrode of the second transistor, wherein a first electrode of the fourth transistor is coupled to the first voltage terminal, and wherein a second electrode of the fourth transistor is coupled to the fourth node;
wherein a second electrode of the fifth transistor is coupled to a control electrode of the fifth transistor and the third node, and wherein the first electrode of the fifth transistor is coupled to a second voltage terminal;
wherein a second electrode of the sixth transistor is coupled to a control electrode of the sixth transistor and the fourth node, and wherein a first electrode of the sixth transistor is coupled to the second voltage terminal;
wherein a control electrode of the seventh transistor is coupled to the control electrode of the fifth transistor, wherein a first electrode of the seventh transistor is coupled to the second voltage terminal, and wherein a second electrode of the seventh transistor is coupled to the second electrode of the sixth transistor;
wherein a control electrode of the eighth transistor is coupled to the control electrode of the sixth transistor, wherein a first electrode of the eighth transistor is coupled to the second voltage terminal, and wherein a second electrode of the eighth transistor is coupled to the second electrode of the fifth transistor;
wherein a control electrode of the eleventh transistor is coupled to a first bias voltage terminal, wherein a first electrode of the eleventh transistor is coupled to the second voltage terminal, and wherein a second electrode of the eleventh transistor is coupled to a first electrode of the twelfth transistor and a first electrode of the thirteenth transistor;
wherein a control electrode of the twelfth transistor is coupled to the first input terminal, and wherein a second electrode of the twelfth transistor is coupled to the first node;
wherein a control electrode of the thirteenth transistor is coupled to the second input terminal, and wherein a second electrode of the thirteenth transistor is coupled to the second node;
wherein a control electrode of a fourteenth transistor is coupled to the fourth node, wherein a first electrode of the fourteenth transistor is coupled to the first voltage terminal, and wherein a second electrode of the fourteenth transistor is coupled to a second electrode of the sixteenth transistor;
wherein a control electrode of the fifteenth transistor is coupled to the third node, wherein a first electrode of the fifteenth transistor is coupled to the first voltage terminal, and wherein a second electrode of the fifteenth transistor is coupled to a fifth node;
wherein a first electrode of the sixteenth transistor is coupled to the second voltage terminal, and wherein a control electrode of the sixteenth transistor is coupled to a second electrode of the sixteenth transistor;

wherein a control electrode of the seventeenth transistor is coupled to the control electrode of the sixteenth transistor, wherein a first electrode of the seventeenth transistor is coupled to the second voltage terminal, and wherein a second electrode of the seventeenth transistor is coupled to the fifth node;

wherein a control electrode of the eighteenth transistor is coupled to the fifth node, wherein a first electrode of the eighteenth transistor is coupled to the first voltage terminal, and wherein a second electrode of the eighteenth transistor is coupled to a signal output terminal; and wherein a control electrode of the nineteenth transistor is coupled to the fifth node, wherein a first electrode of the nineteenth transistor is coupled to the second voltage terminal, and wherein a second electrode of the nineteenth transistor is coupled to the signal output terminal.

14. The comparator according to claim 13, further comprising a ninth transistor and a tenth transistor, wherein a control electrode of the ninth transistor is coupled to a second bias voltage terminal; wherein a first electrode of the ninth transistor is coupled to the second voltage terminal, and wherein a second electrode of the ninth transistor is coupled to the third node; and wherein a control electrode of the tenth transistor is coupled to the second bias voltage terminal, wherein a first electrode of the tenth transistor is coupled to the second voltage terminal, and wherein a second electrode of the tenth transistor is coupled to the fourth node.

15. An analog-to-digital converter comprising a comparator according to claim 1.

16. The comparator according to claim 2, wherein the differential diode-connected transistor comprises a fifth transistor and a sixth transistor, wherein a second electrode of the fifth transistor is coupled to a control electrode of the fifth transistor and the third node, and wherein a first electrode of the fifth transistor is coupled to a second voltage terminal; and wherein a second electrode of the sixth transistor is coupled to a control electrode of the sixth transistor and the fourth node, and wherein a first electrode of the sixth transistor is coupled to the second voltage terminal.

17. The comparator according to claim 16, wherein the differential diode-connected transistor further comprises a seventh transistor and an eighth transistor, wherein a control electrode of the seventh transistor is coupled to the control electrode of the fifth transistor, wherein a first electrode of the seventh transistor is coupled to the second voltage terminal, and wherein a second electrode of the seventh transistor is coupled to the second electrode of the sixth transistor; and wherein a control electrode of the eighth transistor is coupled to the control electrode of the sixth transistor, wherein a first electrode of the eighth transistor is coupled to the second voltage terminal, and wherein a second electrode of the eighth transistor is coupled to the second electrode of the fifth transistor.

18. The comparator according to claim 3, wherein the differential diode-connected transistor comprises a fifth transistor and a sixth transistor, wherein a second electrode of the fifth transistor is coupled to a control electrode of the fifth transistor and the third node, and wherein a first electrode of the fifth transistor is coupled to a second voltage terminal; and wherein a second electrode of the sixth transistor is coupled to a control electrode of the sixth transistor and the fourth node, and wherein a first electrode of the sixth transistor is coupled to the second voltage terminal.

19. The comparator according to claim 18, wherein the differential diode-connected transistor further comprises a seventh transistor and an eighth transistor, wherein a control electrode of the seventh transistor is coupled to the control electrode of the fifth transistor, wherein a first electrode of the seventh transistor is coupled to the second voltage terminal, and wherein a second electrode of the seventh transistor is coupled to the second electrode of the sixth transistor; and wherein a control electrode of the eighth transistor is coupled to the control electrode of the sixth transistor, wherein a first electrode of the eighth transistor is coupled to the second voltage terminal, and wherein a second electrode of the eighth transistor is coupled to the second electrode of the fifth transistor.

20. The comparator according to claim 4, wherein the amplifier circuit further comprises a second current source circuit, and wherein the second current source circuit is coupled to the current mirror and the load circuit, and is configured to provide a second constant current to the load circuit.

* * * * *

UNITED STATES PATENT AND TRADEMARK OFFICE
CERTIFICATE OF CORRECTION

PATENT NO. : 10,924,099 B2
APPLICATION NO. : 16/643241
DATED : February 16, 2021
INVENTOR(S) : Tangxiang Wang et al.

Page 1 of 1

It is certified that error appears in the above-identified patent and that said Letters Patent is hereby corrected as shown below:

In the Claims

In Claim 10, Column 15, Line 19, delete "according claim 1" and insert therefor -- according to claim 1 --.
In Claim 14, Column 17, Line 22, delete "terminal; wherein" and insert therefor -- terminal, wherein --.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*